(12) United States Patent
Chiang et al.

(10) Patent No.: US 6,410,428 B1
(45) Date of Patent: Jun. 25, 2002

(54) NITRIDE DEPOSITION ON TUNGSTEN-POLYCIDE GATE TO PREVENT ABNORMAL TUNGSTEN SILICIDE OXIDATION

(75) Inventors: Wen-Hou Chiang, Judung Jen; Cheng-Sung Huang, Feng-Yuan, both of (TW)

(73) Assignee: ProMos Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/677,745

(22) Filed: Oct. 3, 2000

(51) Int. Cl.[7] .............................................. H01L 21/44
(52) U.S. Cl. ...................... 438/655; 438/299; 438/592; 438/664; 438/683
(58) Field of Search ................... 438/655, 299–307, 438/592, 664, 682–683

(56) References Cited

U.S. PATENT DOCUMENTS

| | | | |
|---|---|---|---|
| 5,600,165 A | * | 2/1997 | Tsukamoto et al. ......... 257/323 |
| 5,888,588 A | | 3/1999 | Nagabushnam et al. . 427/248.1 |
| 5,924,000 A | | 7/1999 | Linliu ......................... 438/592 |
| 5,981,380 A | | 11/1999 | Trivedi et al. ............... 438/639 |
| 6,037,216 A | * | 3/2000 | Liu et al. ..................... 438/253 |
| 6,100,193 A | | 8/2000 | Suehiro et al. ............. 438/685 |
| 6,124,165 A | * | 9/2000 | Lien ............................ 438/253 |

OTHER PUBLICATIONS

Wolf, "silicon processing for the VLSI ERA" 1986, vol. 1, pp. 191–195.*

* cited by examiner

Primary Examiner—John F. Niebling
Assistant Examiner—Thanh Nguyen
(74) Attorney, Agent, or Firm—George O. Saile; Stephen B. Ackerman; Stephen G. Stanton

(57) ABSTRACT

A method of forming a non-oxidized $WSi_x$ layer on a semiconductor wafer, including the following steps. A semiconductor wafer having a silicon substrate is provided within a CVD tool. A $WSi_x$ layer is formed over the silicon substrate. An SiN layer is formed upon the WSix layer in absence of $O_2$; whereby the $WSi_x$ layer is non-oxidized.

15 Claims, 3 Drawing Sheets

US 6,410,428 B1

NITRIDE DEPOSITION ON TUNGSTEN-POLYCIDE GATE TO PREVENT ABNORMAL TUNGSTEN SILICIDE OXIDATION

BACKGROUND OF THE INVENTION

High temperature CVD dichlorosilane (DC) tungsten silicide ($WSi_x$) and in-situ doped CVD polysilicon (poly) have been widely used as gate materials in VLSI metal oxide semiconductors (MOS). However, low temperature (>600° C.) oxidation of $WSi_x$ makes the $WSi_x$ process control very critical on tungsten (W) ratio and makes later process integration more difficult.

U.S. Pat. No. 6,100,193 to Suehiro et al. describes an in-situ tungsten deposition and an SiN CVD step for a tungsten gate.

U.S. Pat. No. 5,981,380 to Trivedi et al., U.S. Pat. No. 5,924,000 to Linliu, and U.S. Pat. No. 5,888,588 to Nagabushnam et al. describe various $WSi_x$ processes.

SUMMARY OF THE INVENTION

Accordingly, it is an object of the present invention to provide a method of forming tungsten polycide gate electrodes without tungsten silicide oxidation.

Other objects will appear hereinafter.

It has now been discovered that the above and other objects of the present invention may be accomplished in the following manner. Specifically, a semiconductor wafer having a silicon substrate is provided. A $WSi_x$ layer is formed over the silicon substrate. An SiN layer is formed upon the $WSi_x$ layer in the absence of $O_2$; whereby the $WSi_x$ layer is non-oxidized.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Problem Known to the Inventor

The following problem known to the inventor is not to be considered prior art for the purposes of this invention.

In the formation of a gate electrode, after the gate stack polysilicon (poly)/tungsten silicide ($WSi_x$) deposition, a furnace low pressure chemical vapor deposition (LPCVD) silicon nitride (SiN) may be deposited for SAC (self-aligned contact) borderless contact and/or as a hard mask of a gate conductor (GC) borophosphosilicate (BPSG) chemical mechanical polish (CMP) stop layer (about 2000 Å). However the oxygen ($O_2$) residue in the SiN furnace will cause the $WSi_x$, abnormal oxidation to form bump defects and/or forms more serious haze (discoloration).

These defects will make it difficult to do further photo lithography or etching processing of the wafer and causes word-line contact shorts and low yield. To prevent the abnormal oxidation of the $WSi_x$, the oxygen residue in the SiN furnace and the tungsten (W) ratio in the $WSi_x$ process must be well controlled. To control the oxygen residue in the SiN furnace, a nitrogen ($N_2$) loadlock or a large $N_2$ purge while loading the wafer to be processed must be implanted which increases the cost of fabrication.

Sometimes the SiN furnace loading abort without SiN deposition still has abnormal $WSi_x$, oxidation to cause voids between the $WSi_x$/poly interface. Abnormal oxidation of $WSi_x$ is caused by its exposure to oxygen at high temperatures. In other words, $WSi_x$, won't be oxidized if it is exposed to the atmosphere (oxygen) only at room temperature. There are two possible abnormal situations of $WSi_x$ oxidation in the prior technology: (a) there is a large leakage in the LP-furnace before the $WSi_x$ deposition process; or (b) there. is a small amount of residual oxygen in the LP-furnace. In situation (a), the temperature is from about 600 to 700° C. even before the $WSi_x$, deposition begins therefore this results in the abnormal oxidation of the $WSi_x$ before the wafer aborted. In situation (b), the residual oxygen and high process temperature (from about 800 to 900° C.) results in the abnormal oxidation of $WSi_x$ also. Although it can be difficult to prevent a situation (a) from occurring, situation (b) can be prevented by purging the furnace with a large amount of nitrogen gas before transferring the wafer to the furnace. However, such a nitrogen purge to prevent situation (b) wastes money and time.

PREFERRED EMBODIMENT OF THE PRESENT INVENTION

Summary of the Invention

Figure 4:
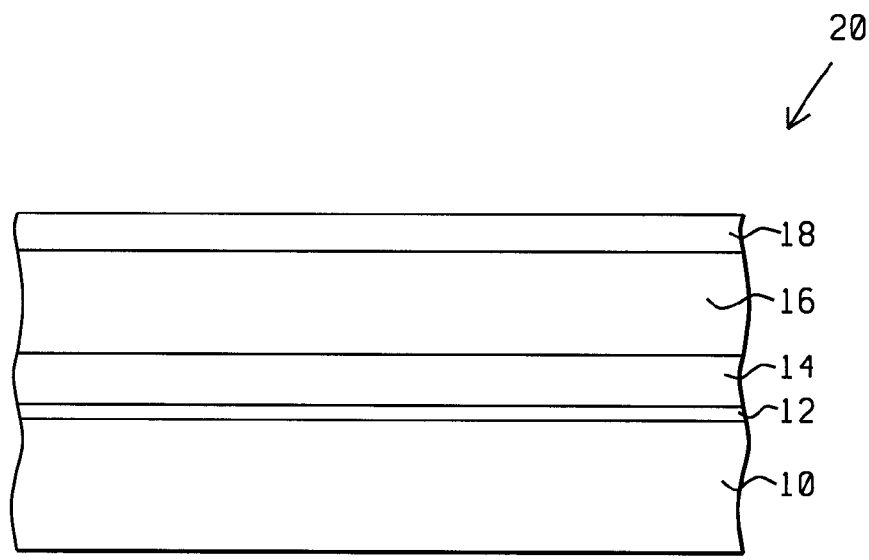

The key point of the present invention is to prevent the abnormal oxidation of $WSi_x$ by completing the serial poly-gate formation process in the same CVD platform/tool 110 without exposure to the atmosphere/air. That is, the poly 14, $WSi_x$, 16, and nitride 18 are deposited in the same (in situ) or different chamber(s) in the same CVD platform 110. Three optimal methods have been discovered to effectuate this nitride deposition (please refer to FIGS. 4 and 5):

(1) FIRST METHOD (FIG. 5A): without exposure to air and within tool 110*a*, SiN layer 18 is deposited over $WSi_x$ layer 16 either: in situ within $WSi_x$ chamber 102*a* or 102*b*; or after transferring wafer 20 to poly chamber 100*b* or 100*a* by reacting either:

(A): $SiH_4 + NH_3$ (at about 1 atmosphere and from about 700 to 900° C.); or (B) DCS ($SiCl_2H_2$)+$NH_3$ (less than about 1 atmosphere and at about 700° C.);

(2) SECOND METHOD (FIG. 5B): add an LP nitride chamber 108 to tool 110*a* to form modified tool 100*b* and, without exposure to air and within tool 110*a*, SiN layer 18 is deposited over $WSi_x$, layer 16 after transferring wafer 20 to LP nitride chamber 108 by reacting either:

(A): $SiH_4 + NH_3$ (at about 1 atmosphere and from about 700 to 900° C.); or (B) DCS ($SiCl_2H_2$)+$NH_3$ (less than about 1 atmosphere and at about 700° C.); or (3) THIRD METHOD (FIG. 5C): add a PE nitride chamber 130 to tool 110*a* to form modified tool 100*c* and, without exposure to air and within tool 110*a*, SiN layer 18 is deposited over $WSi_x$ layer 16 after transferring wafer 20 to PE nitride chamber 130 by reacting:

$SiH_4 + NH_3$ or $N_2$ (at from about 200 to 300° C.).

The SiN film 18 so formed by either (1), (2), or (3) above may either be a thin film to protect $WSi_x$ layer 16 from being oxidized by atmosphere/air and then the wafer 20 is transferred to an SiN furnace to complete formation of a thicker SiN layer 18, or further processing of wafer 20 is continued with the thin SiN layer 18. Another option is to complete the whole SiN layer 18 directly within either LP nitride chamber 108 or PE chamber 130 on the same mainframe/tool 110b or 110c, respectively, without exposure to the atmosphere/air (see FIGS. 5B and 5C).

Figure 5A:
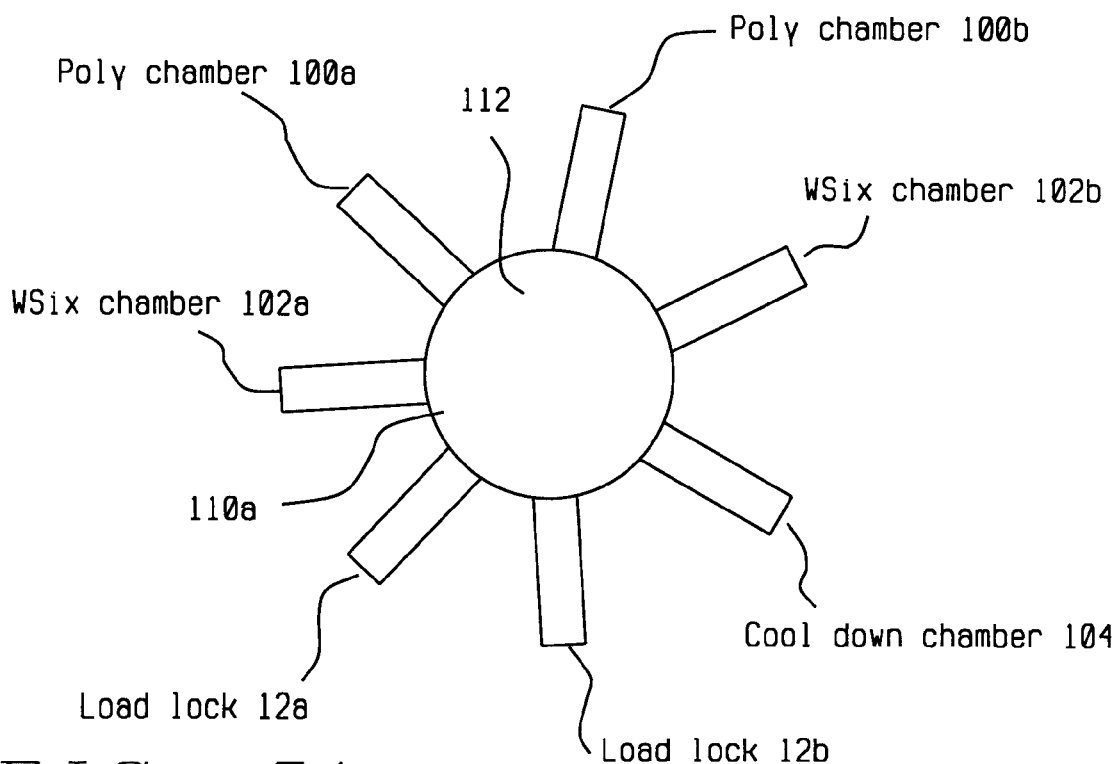
FIGS. 5A, 5B, and 5C are schematic illustrations of tools which may be used to practice the present invention for the first, second, and third methods, respectively.
Figure 5B:
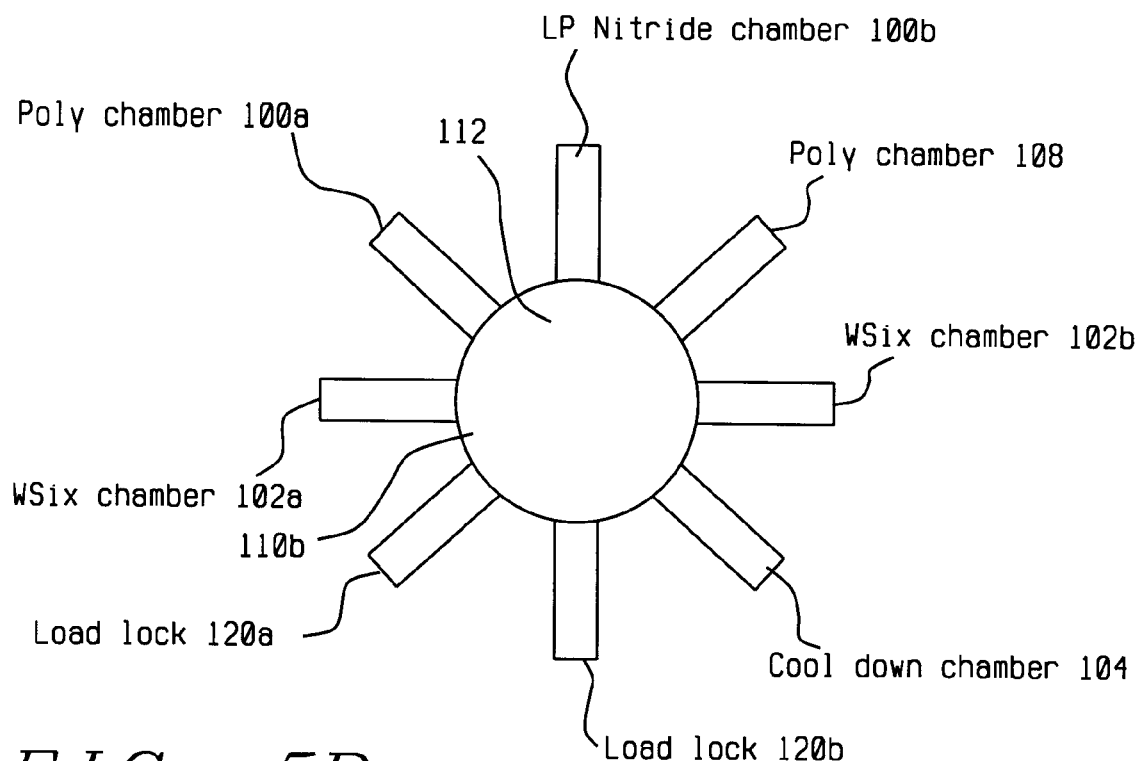
Figure 5C:
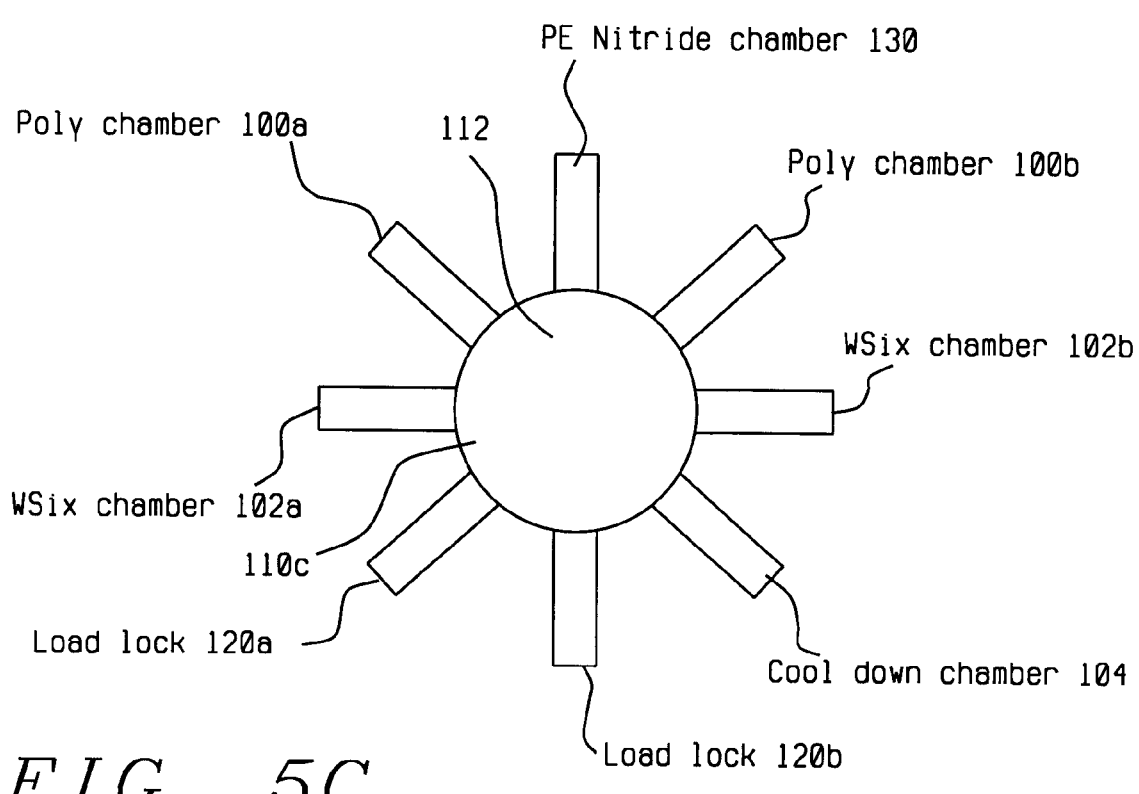
Figure 5B:
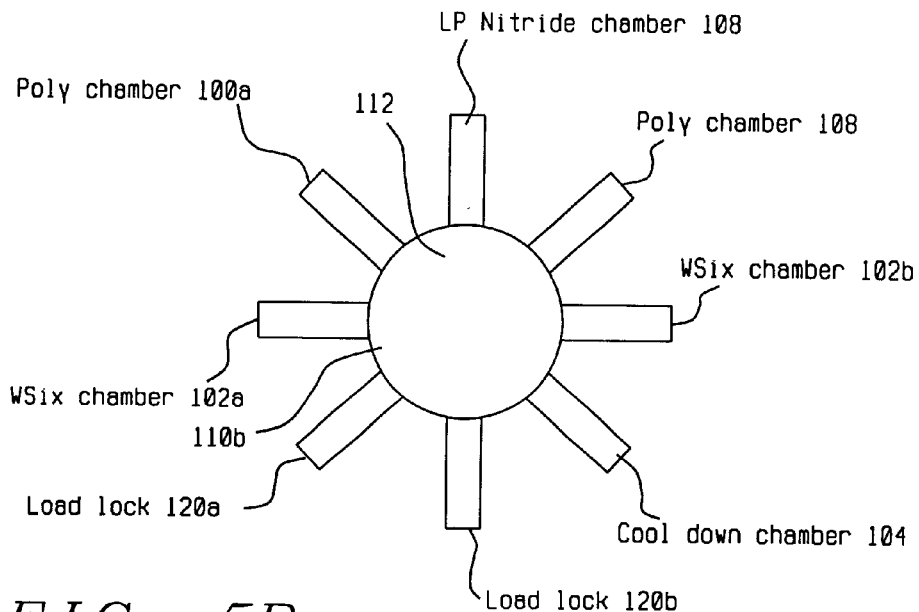
Figure 5C:
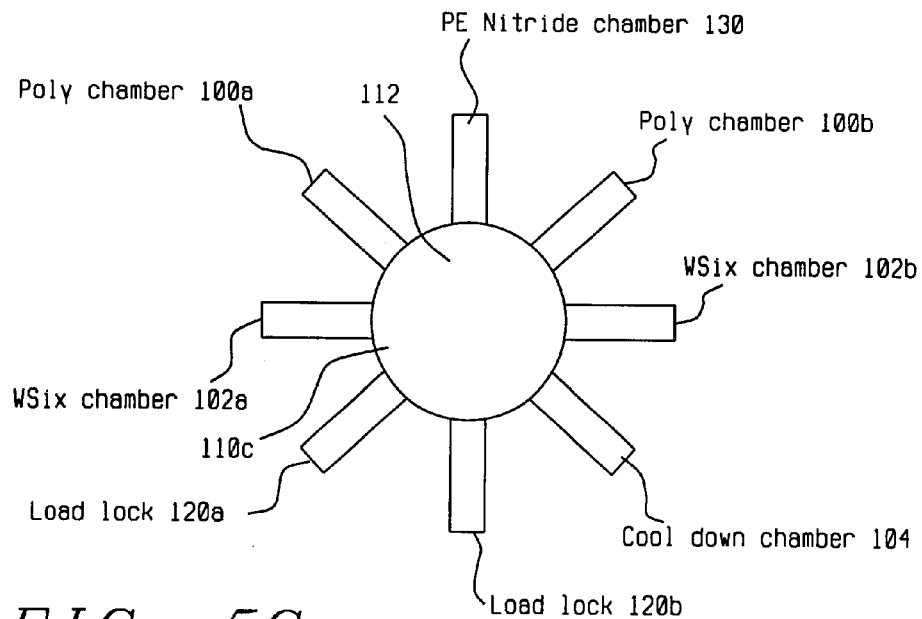

Accordingly FIGS. 5A to 5C illustrates example tools/mainframes 110a, 110b, and 110c with which the present invention may be used. Tools 110a, 110b, and 10c each include, load locks 120a, b, cool down chamber 104, and, inter alia, a central transfer chamber 112 through which wafer 20 may be transferred between chambers 100a, 100b, 102a, 102b, 104, 106, 108, 120a, 120b for example (and LP nitride chamber 108 in tool 110b, and PE nitride-chamber 130 in tool 110c). The preferred tool 110a is a Polycide/Poly Centura system manufactured by Applied Materials of U.S.A which may be modified as indicated to form tool 110b or 110c.

Figure 1:
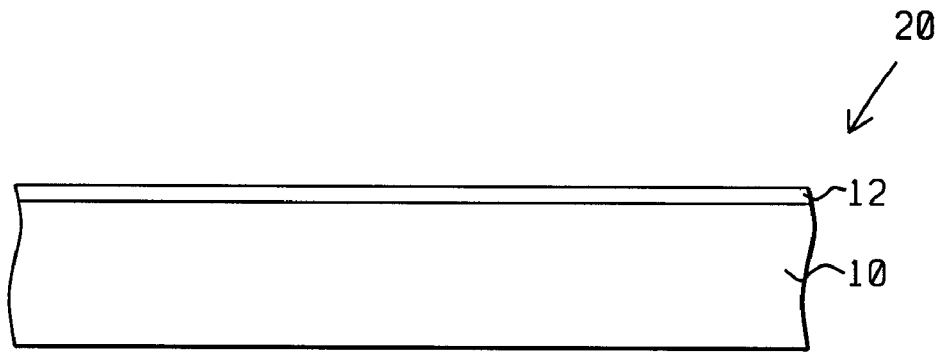
FIGS. 1 through 4 schematically illustrate in cross-sectional representation a preferred embodiment of the present invention.

As shown in FIG. 1, wafer 20 includes silicon substrate 10 and may further include overlying gate oxide layer 12 formed within a TEL alpha 8S furnace. Gate oxide layer 12 is preferably from about 45 to 90 Å thick, and more preferably from about 50 to 85 Å thick.

Figure 2:
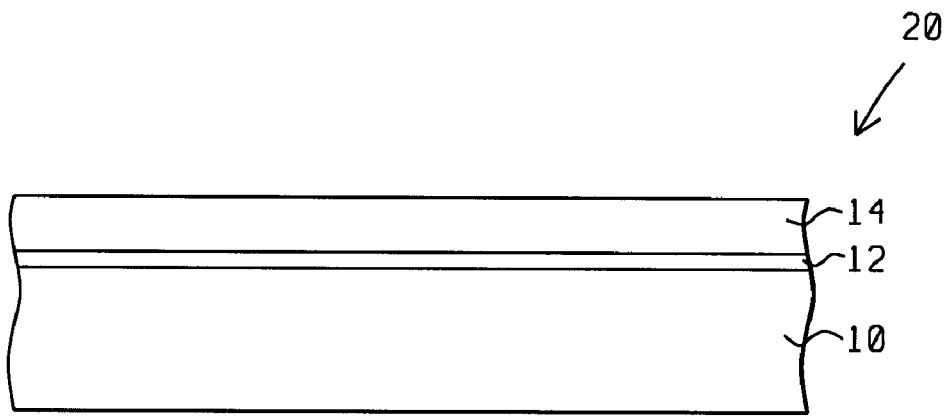

As shown in FIG. 2, polysilicon (poly) layer 14 is formed over gate oxide layer 12 within poly chamber 100 to a thickness of preferably from about 850 to 1150 Å, and more preferably from about 900 to 1110 Å.

Figure 3:
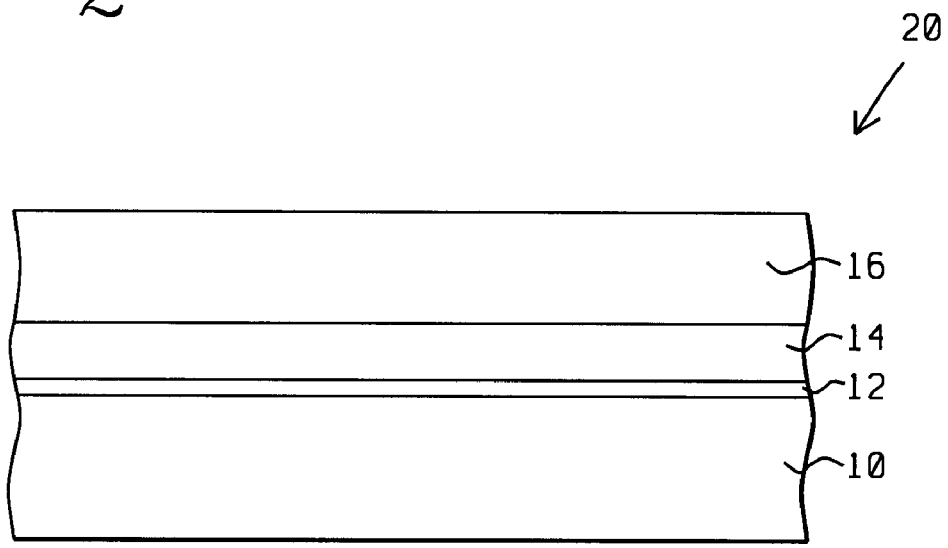

As shown in FIG. 3, $WSi_x$ layer 16 is formed over poly layer 14 within $WSi_x$ chamber 102 to a thickness of preferably from about 450 to 800 Å, and more preferably from about 500 to 750 Å in the absence of air/$O_2$.

In a key step of the invention, SiN layer 18 is then formed over $WSi_x$ layer 16 within the same mainframe/tool 110 without exposing $WSi_x$ layer 16 to air/the atmosphere. Three optimal methods have been discovered to effectuate this nitride deposition, with the first method being more preferred and the third method being most preferred:

First Method (FIG. 5A) (more preferred method):

In the first method, wafer 20 is maintained within $WSi_x$ chamber 102a or 102b (in situ), or is transferred back to poly chamber 100a or 100b, respectively, and, without exposure to air/$O_2$, SiN layer 18 is formed over $WSi_x$, layer 16 by either of the following two alternate processes:

Process One:
preferably from about 50 to 1000 sccm of $SiH_4$;
is reacted with preferably from about 50 to 1000 sccm of $NH_3$;
at preferably from about 5 to 760 Torr, and more preferably about 1 atmosphere;
at preferably from about 300 to 1000° C.; and more preferably from about 700 to 900° C.; and
for from about 5 to 50 seconds to form SiN layer 18 having a thickness of from about 10 to 2500 Å; or Process Two
preferably from about 50 to 1000 sccm of DCS ($SiCl_2H_2$);
is reacted with preferably from about 50 to 1000 sccm of $NH_3$;
at preferably from about 5 to 760 Torr, and more preferably less than about 1 atmosphere;
at preferably from about 300 to 1000° C.; and more preferably about 700° C.; and
for from about 5 to 50 seconds to form SiN layer 18 having a thickness of from about 10 to 2500 Å.

Second Method (FIG. 5B)

In the second method, LP nitride chamber 108 is added to tool 110a to form tool 110b and, without exposure to air/$O_2$, SiN layer 18 is formed over $WSi_x$ layer 16 after transferring wafer 20 to LP nitride chamber 108 by either of the following two alternate processes:

Process One:
preferably from about 50 to 1000 sccm of $SiH_4$;
is reacted with preferably from about 50 to 1000 sccm of $NH_3$;
at preferably from about 5 to 760 Torr, and more preferably about 1 atmosphere;
at preferably from about 300 to 1000° C.; and more preferably from about 700 to 900° C.; and
for from about 5 to 50 seconds to form SiN layer 18 having a thickness of from about 10 to 2500 Å; or Process Two
preferably from about 50 to 1000 sccm of DCS ($SiCl_2H_2$);
is reacted with preferably from about 50 to 1000 sccm of $NH_3$;
at preferably from about 5 to 760 Torr, and more preferably, less than about 1 atmosphere;
at preferably from about 300 to 1000° C.; and more preferably about 700° C.; and
for from about 5 to 50 seconds to form SiN layer 18 having a thickness of from about 10 to 2500 Å.

Third Method (FIG. 5C) (most preferred method):

In the third method, PE nitride chamber 130 is added to the same mainframe (tool) 110a to form tool 110c and, without exposing to air/$O_2$, and SiN layer 18 is formed over $WSi_x$ layer 16 by reacting:
preferably from about 50 to 1000 sccm of $SiH_4$;
is reacted with preferably from about 50 to 1000 sccm of $NH_3$, or preferably from about 50 to 1000 sccm of $N_2$;
at preferably from about 5 to 200 Torr;
at preferably from about 200 to 700° C.; and more preferably from about 200 to 300° C.; and
for from about 5 to 50 seconds to form SiN layer 18 having a thickness of from about 10 to 2500 Å.

Thin SiN Film 18

SiN layer/film 18 so formed may be a thin film (having a thickness of preferably from about 10 to 100 Å by adjusting the above parameters accordingly) and either:

transferring wafer 20 into an SiN furnace to complete formation of SiN layer/film to a thickness of preferably from about 1700 to 2600 Å, and more preferably from about 1800 to 2500 Å; or transferring wafer 20 into an appropriate chamber and continue the further processing of wafer 20.

SiN thin film 18 is formed by the first or second methods noted above, i.e. by leaving wafer 20 in $WSi_x$ chamber 102a, or 102b or transferring wafer 20 back to poly chamber 100a or 100b, respectively.

Thick SiN Film 18

SiN layer/film 18 may also be a thick film (having a thickness of preferably from about 1700 to 2600 Å, and more preferably from about 1800 to 2500 Å as formed by a PECVD process by transferring wafer 20 into PECVD SiN chamber 108 by the third method above.

In any event, WSi$_x$ layer 16 is formed without abnormal oxidation by the formation of SiN layer/film 18 over WSi$_x$ layer 16 in the same mainframe/tool 110 without exposure to air/O$_2$ in accordance with the present invention. SiN layer/film 18 so formed protects WSi$_x$ layer 16 form air/O$_2$ and thus abnormal oxidation during any further processing.

Advantages of the Present Invention

The advantages of the present invention include preventing abnormal oxidation of WSi$_x$, film.

While particular embodiments of the present invention have been illustrated and described, it is not intended to limit the invention, except as defined by the following claims.

We claim:

1. A method of forming a non-oxidized tungsten silicide layer on a semiconductor wafer, including the steps of:
   providing a semiconductor wafer having a silicon substrate within a CVD tool;
   forming a tungsten silicide layer over the silicon substrate; and
   forming an SiN layer upon the tungsten silicide layer in the absence of O$_2$;
whereby the tungsten silicide layer is non-oxidized; whereby the tungsten silicide layer is formed in a first chamber within the CVD tool, the semiconductor wafer is then transferred to a second chamber within the CVD tool before formation of the SiN layer upon the tungsten silicide layer.

2. The method of claim 1, further including the step of forming a polysilicon layer over the silicon substrate; whereby the tungsten silicide layer is formed upon the polysilicon layer.

3. The method of claim 1, further including the step of forming a polysilicon layer the polysilicon layer having a thickness of from about 900 to 100 Å over the silicon substrate within the CVD tool; whereby the tungsten silicide layer is formed upon the polysilicon layer ; the tungsten silicide layer having a thickness of from about 500 to 750 Å.

4. The method of claim 1, further including the steps of:
   forming a gate oxide layer having a thickness of from about 45 to 90 Å upon the silicon substrate;
   forming a polysilicon layer having a thickness of from about 850 to 1150 Å upon the gate oxide layer within the CVD tool;
whereby the tungsten silicide layer is formed upon the polysilicon layer; the tungsten silicide layer having a thickness of from about 450 to 800 Å.

5. The method of claim 1, wherein the tungsten silicide layer is formed within a tungsten silicide chamber and the semiconductor wafer is transferred to an LP nitride chamber before formation of the SiN layer within the LP nitride chamber.

6. The method of claim 1, wherein the tungsten silicide layer is formed within a tungsten silicide chamber and the semiconductor wafer is transferred to a PE nitride chamber before formation of the SiN layer within the PE nitride chamber.

7. A method of forming a non-oxidized tungsten silicide layer on a semiconductor wafer, including the steps of:
   providing a semiconductor wafer having a silicon substrate within a CVD tool;
   forming a polysilicon layer over the silicon substrate;
   forming a tungsten silicide layer over the polysilicon layer; and
   forming an SiN layer upon the tungsten silicide layer in the absence of O$_2$;
whereby the tungsten silicide layer is non-oxidized; whereby the tungsten silicide layer is formed in a first chamber within the CVD tool, the semiconductor wafer is then transferred to a second chamber within the CVD tool before formation of the SiN layer upon the tungsten silicide layer; whereby the tungsten silicide layer is formed in a first chamber within the CVD tool, the semiconductor wafer is then transferred to a second chamber within the CVD tool before formation of the SiN layer upon the tungsten silicide layer.

8. The method of claim 7, wherein the polysilicon layer has a thickness of from about 900 to 1100 Å and the tungsten silicide layer has a thickness of from about 500 to 750 Å.

9. The method of claim 7, further including the steps of:
   forming a gate oxide layer having a thickness of from about 45 to 90 Å upon the silicon substrate;
whereby the polysilicon layer is formed upon the gate oxide layer and wherein the polysilicon layer has a thickness of from about 850 to 1150 Å and the tungsten silicide layer has a thickness of from about 450 to 800 Å.

10. The method of claim 7, wherein the tungsten silicide layer is formed within a tungsten silicide chamber and the semiconductor wafer is transferred to an LP nitride chamber before formation of the SiN layer within the LP nitride chamber.

11. The method of claim 7, wherein the tungsten silicide layer is formed within a tungsten silicide chamber and the semiconductor wafer is transferred to a PE nitride chamber before formation of the SiN layer within the PE nitride chamber.

12. A method of forming a non-oxidized tungsten silicide layer on a semiconductor wafer, including the steps of:
   providing a semiconductor wafer having a silicon substrate within a CVD tool;
   forming a gate oxide layer upon the silicon substrate;
   forming a polysilicon layer upon the gate oxide layer;
   forming a tungsten silicide layer over the polysilicon layer; and
   forming an SiN layer upon the tungsten silicide layer in the absence of O$_2$;
whereby the tungsten silicide layer is non-oxidized;. whereby the tungsten silicide layer is formed in a first chamber within the CVD tool, the semiconductor wafer is then transferred to a second chamber within the CVD tool before formation of the SiN layer upon the tungsten silicide layer.

13. The method of claim 12, wherein the gate oxide layer has a thickness of from about 45 to 90 Å, the polysilicon layer has a thickness of from about 900 to 1100 Å and the tungsten silicide layer has a thickness of from about 500 to 750 Å.

14. The method of claim 12, wherein the tungsten silicide layer is formed within a tungsten silicide chamber and the semiconductor wafer is transferred to an LP nitride chamber before formation of the SiN layer within the LP nitride chamber.

15. The method of claim 12, wherein the tungsten silicide layer is formed within a tungsten silicide chamber and the semiconductor wafer is transferred to a PE nitride chamber before formation of the SiN layer within the PE nitride chamber.

* * * * *

UNITED STATES PATENT AND TRADEMARK OFFICE
CERTIFICATE OF CORRECTION

PATENT NO.   : 6,410,428 B1
DATED        : June 25, 2002
INVENTOR(S)  : Wen-Hou Chiang and Cheng-Sung Huang It is certified that error appears in the above-identified patent and that said Letters Patent is hereby corrected as shown below:

<u>Drawings,</u>
Sheet 3 of 3 of the drawings, in Fig. 5B, please delete "LP Nitride chamber 100b", and replace it with -- LP Nitride chamber 108 --.

Signed and Sealed this

Twenty-third Day of September, 2003

JAMES E. ROGAN
*Director of the United States Patent and Trademark Office*